(12) United States Patent
Takiguchi et al.

(10) Patent No.: US 12,124,080 B2
(45) Date of Patent: Oct. 22, 2024

(54) PHOTONIC CRYSTAL DEVICE AND ATOM TRAPPING DEVICE

(71) Applicant: Nippon Telegraph and Telephone Corporation, Tokyo (JP)

(72) Inventors: Masato Takiguchi, Tokyo (JP); Tetsuya Mukai, Tokyo (JP); Masaya Notomi, Tokyo (JP); Naotomo Takemura, Tokyo (JP); Akihiko Shinya, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 207 days.

(21) Appl. No.: 17/914,100

(22) PCT Filed: Apr. 21, 2020

(86) PCT No.: PCT/JP2020/017175
§ 371 (c)(1),
(2) Date: Sep. 23, 2022

(87) PCT Pub. No.: WO2021/214864
PCT Pub. Date: Oct. 28, 2021

(65) Prior Publication Data
US 2023/0108297 A1    Apr. 6, 2023

(51) Int. Cl.
*G02B 6/122*    (2006.01)
*G02B 1/00*    (2006.01)
*H01S 5/11*    (2021.01)

(52) U.S. Cl.
CPC .......... *G02B 6/1225* (2013.01); *G02B 1/005* (2013.01); *H01S 5/11* (2021.01)

(58) Field of Classification Search
None
See application file for complete search history.

(56) References Cited

PUBLICATIONS

Aoki et al., "Efficient Routing of Single Photons by One Atom and a Microtoroidal Cavity," Physical Review Letters, Feb. 2009, vol. 102, No. 8, 4 pages.
Goban et al., "Atom-light interactions in photonic crystals," Nature Communications, May 8, 2014, vol. 5, 9 pages.
Kien et al., "Microtraps for atoms outside a fiber illuminated perpendicular to its axis: Numerical results," Physical Review A, the American Physical Society, vol. 80, No. 1, 2009, 6 pages.
Ritter et al., "Coupling Thermal Atomic Vapor to Slot Waveguides," Physical Review X, vol. 8, No. 2, 2018, 10 bages.

*Primary Examiner* — Chad H Smith
(74) *Attorney, Agent, or Firm* — Slater Matsil, LLP

(57) ABSTRACT

A photonic crystal device to be used for trapping an atom and including a photonic crystal body, a slot waveguide, and an attractive force trap light laser. The photonic crystal body includes a base and a plurality of lattice elements periodically provided on the base, the slot waveguide is arranged between periodic lattice rows and includes an opening on one side face of the photonic crystal body, and the attractive force trap light laser is excited by excitation light incident from the opening and oscillates at a wavelength being longer than a wavelength of an absorption edge of the atom.

12 Claims, 11 Drawing Sheets

PHOTONIC CRYSTAL DEVICE AND ATOM TRAPPING DEVICE

CROSS-REFERENCE TO RELATED APPLICATIONS

This application is a national phase entry of PCT Application No. PCT/JP2020/017175, filed on Apr. 21, 2020, which application is hereby incorporated herein by reference.

TECHNICAL FIELD

The present invention relates to an atom trapping device with a small size and low power consumption.

BACKGROUND

In recent years, in development of quantum information devices such as quantum computers, single-photon sources, quantum simulators and the like, and platforms thereof, various materials such as superconducting quantum bits, defects in diamond (NV centers), ion traps, cold atoms, semiconductor quantum dots, and the like are listed as candidates, and research thereof is underway. The cold atoms that are one of the candidates are naturally occurring materials, so there is no variation in bright lines of emission light, unlike quantum dots and the like. Thus, application to very high quality single-photon sources, quantum repeaters in communicating spatially at different locations, and the like is expected.

However, measurement devices (atom trapping devices) that use these cold atoms require large equipment such as a large vacuum chamber, a plurality of lasers, a mechanism for frequency stabilization, and the like, and thus, the devices are complicated and made significantly larger. In addition, energy consumption is also a major concern to trap (dipole trap) atoms by using a high power laser.

For the reasons described above, in recent years, research has been performed in which cold atoms are integrated into a nano-optical circuit. If light can be confined in a nano region, the light density can be sufficiently increased even when laser power is low. An atom trapping device that uses a structure in which an optical fiber has been processed in a tapered manner (NPL 1), a silica microresonator (NPL 2), and a trench waveguide (NPL 3) have been developed.

However, in a case of an optical fiber, as a base material is glass (SiO2), the refractive index is as low as 1.4, and light confinement cannot be made to be strong. Also, a common trench waveguide has the low degree of freedom in optical design, which limits the optimization of light density to trap atoms.

To solve these problems, in recent years, atom trapping (capturing) using a photonic crystal has attracted attention (NPL 4). With the photonic crystal, atoms can be trapped even with very low input power because the higher material refractive index and photonic band gap can strongly confine light in a very small region.

CITATION LIST

Non Patent Literature

NPL 1: Fam Le Kien and K. Hakuta, "Microtraps for atoms outside a fiber illuminated perpendicular to its axis: Numerical results", Phys. rev. A 80, 013415 (2009).

NPL 2: Takao Aoki, A. S. Parkins, D. J. Alton, C. A. Regal, Barak Dayan, E. Ostby, K. J. Vahala, and H. J. Kimble, "Efficient Routing of Single Photons by One Atom and a Microtoroidal Cavity", Phys. Rev. Lett. 102, 083601 (2009)

NPL 3: Ralf Ritter, Nico Gruhler, Helge Dobbertin, Harald Kubler, Stefan Scheel, Wolfram Pernice, Tilman Pfau, and Robert Low, "Coupling Thermal Atomic Vapor to Slot Waveguides", Phys. Rev. X 8, 021032 (2018)

NPL 4: A. Goban, C.-L. Hung, S.-P. Yu, J. D. Hood, J. A. Muniz, J. H. Lee, M. J. Martin, A. C. McClung, K. S. Choi, D. E. Chang, O. Painter & H. J. Kimble, "Atom-light interactions in photonic crystals", Nature Communications, 5, 3808 (2014).

SUMMARY

Technical Problem

However, the trapping device in the current device, in which the photonic crystal is used, has increased in size of the overall device because a device that oscillates laser light to be used for atom trapping is disposed outside the photonic crystal. In addition, the laser light needs to be guided from the outside, an optical coupling loss at an end face of an input/output waveguide is large, and thus, a large amount of power is required to operate the device.

An object of embodiments of the present invention is to provide an on-chip atom trapping device with a small size and low power consumption by using a photonic crystal laser.

Means for Solving the Problem

To solve the issues described above, a photonic crystal device according to embodiments of the present invention is a photonic crystal device to be used for trapping an atom and including a photonic crystal body, a slot waveguide, and an attractive force trap light laser. The photonic crystal body includes a base and a plurality of lattice elements periodically provided on the base, the slot waveguide is arranged between periodic lattice rows and includes an opening on one side face of the photonic crystal body, and the attractive force trap light laser is excited by excitation light incident from the opening and oscillates at a wavelength being longer than a wavelength of an absorption edge of the atom.

In addition, an atom trapping device according to embodiments of the present invention is an atom trapping device that traps an atom and including a photonic crystal body, a slot waveguide, an attractive force trap light laser, and a repulsive force trap light laser. The photonic crystal body includes a base and a plurality of lattice elements periodically provided on the base, the slot waveguide is arranged between periodic lattice rows within the photonic crystal body, the attractive force trap light laser oscillates at a wavelength being longer than a wavelength of an absorption edge of the atom, the repulsive force trap light laser oscillates at a wavelength being shorter than the wavelength of the absorption edge of the atom, and the attractive force trap light laser and the repulsive force trap light laser are arranged in such a manner that light of the attractive force trap light laser and light of the repulsive force trap light laser are incident on the slot waveguide.

Effects of Embodiments of the Invention

According to embodiments of the present invention, an atom trapping device with a small size and low power consumption can be provided.

DETAILED DESCRIPTION OF ILLUSTRATIVE EMBODIMENTS

First Embodiment

Figure 1:
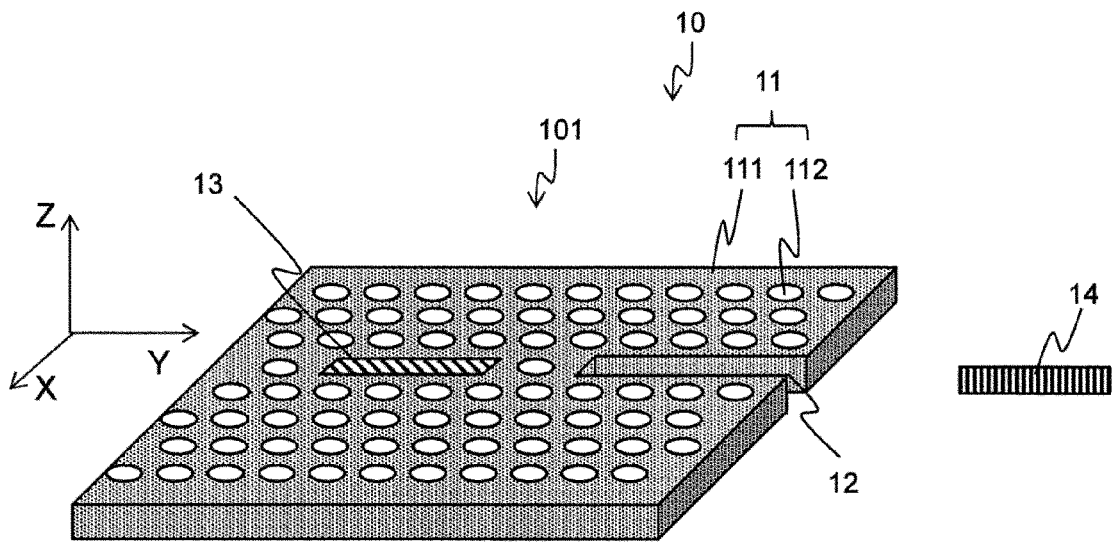
FIG. 1 is an overview of an atom trapping device according to a first embodiment of the present invention.
Figure 2:
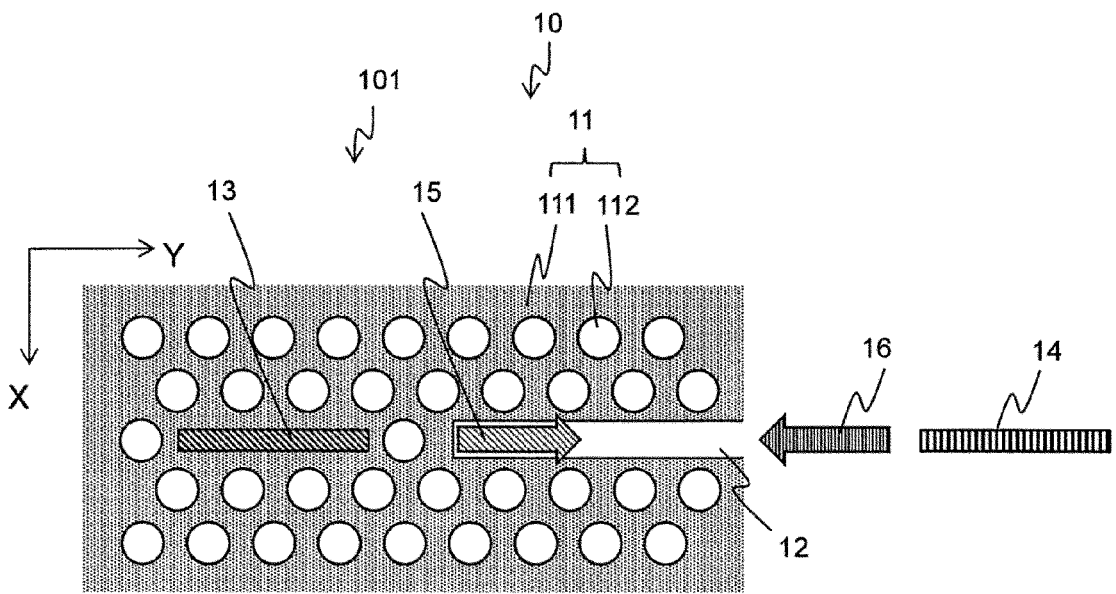
FIG. 2 is a top view of the atom trapping device according to the first embodiment of the present invention.

Next, a first embodiment of the present invention will be described with reference to FIGS. 1 to 8.
Configuration of Atom Trapping Device FIGS. 1 and 2 respectively illustrate an external view and a top view of an atom trapping device 10 according to the present embodiment. The atom trapping device 10 includes a photonic crystal device 101 and an excitation laser 14. The photonic crystal device 101 includes a photonic crystal body 11, a slot waveguide 12, and an attractive force trap light laser 13.

Hereafter, in the drawings, an XY plane will be referred to as a horizontal plane. Furthermore, an X direction will be referred to as a horizontal direction, and a Y direction will be referred to as a waveguide direction. In addition, a Z direction will be referred to as a vertical direction.

To excite the attractive force trap light laser 13, the excitation laser 14 is disposed outside the photonic crystal device 101, and excitation light from the excitation laser 14 is made to be incident on the slot waveguide 12.

Figure 3:
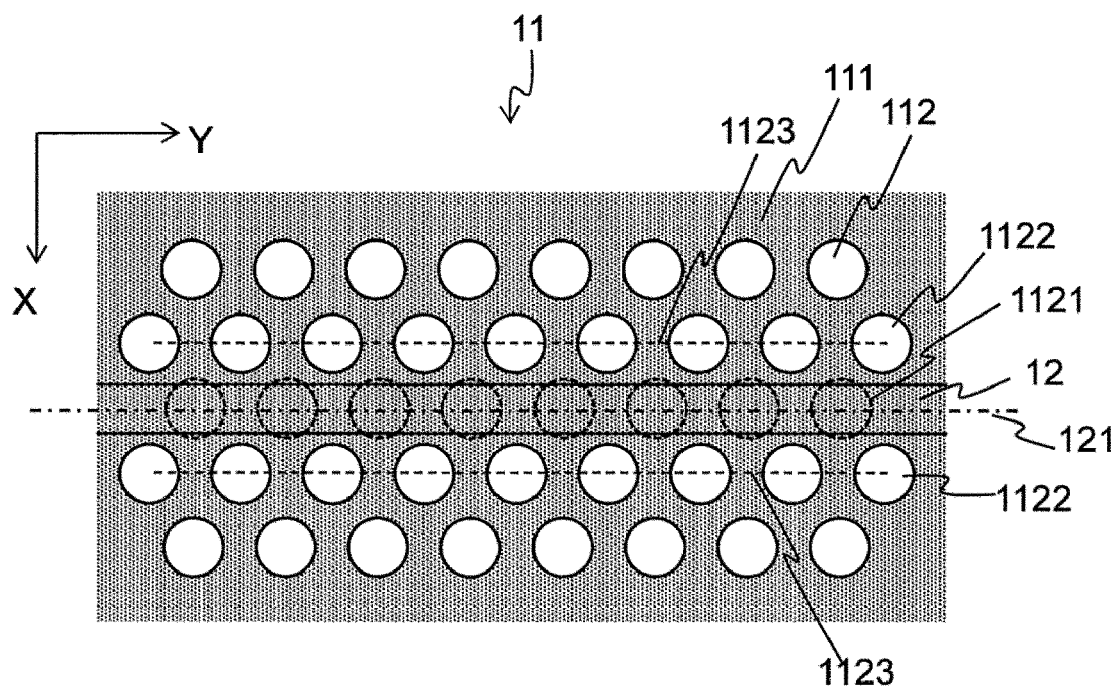
FIG. 3 is a top view of a photonic crystal body according to the first embodiment of the present invention.

A top view of the photonic crystal body 11 is illustrated in FIG. 3. The photonic crystal body 11 is a so-called two-dimensional slab type photonic crystal, and is configured of a base 111 and a plurality of lattice elements 112. The lattice element 112 has a different refractive index from that of the base and is periodically provided in a triangular lattice shape. In the present embodiment, a cylindrical hollow structure is used.

For example, the photonic crystal body 11 is formed of silicon nitride (SiNx) that can also be used in a visible light region when a rubidium atom having an absorption line of 780 nm is assumed. At this time, the photonic crystal may be another material such as silicon carbide (SiC), titanium oxide (TiO2) or the like because the photonic crystal is only required to pass light from visible light to near-infrared light.

A thickness of the photonic crystal body 11 is 200 nm. A diameter of the circular hole 112 is 200 nm, and a distance (lattice constant) between the circular holes in the triangular lattice is 330 nm. These sizes correspond to an absorption wavelength of rubidium and differ in design due to a target atom. For example, in a case of strontium having a short absorption wavelength, the diameter and lattice constant of the circular hole decrease in proportion to the wavelength.

The slot waveguide 12 penetrates through a slab and has a width of approximately from 50 nm to 100 nm and a length of several tens of nm. The length of the slot waveguide is not limited to this.

The photonic crystal body 11 is provided with the slot waveguide 12. The slot waveguide 12 includes an opening on one side face of the photonic crystal body 11. The slot waveguide 12 has a trench structure and has a cross section having a rectangular shape. Here, the cross-sectional shape is not limited to the rectangular shape, and may be a trapezoidal shape being convex upward or a trapezoidal shape being convex downward. As described below, the shape is only required to be a shape in which atoms are confined in the slot waveguide.

The slot waveguide 12 is arranged between the periodic lattice rows. In particular, the slot waveguide 12 is arranged in a space after one row of the periodic lattice rows (for example, a row configured of circles 1121 denoted by dotted lines in FIG. 3) is removed in the photonic crystal body 11. Hereinafter, the "periodic lattice row" refers to a row of lattice elements 112 arranged on a straight line that connects between the lattice elements 112 nearest to each other in the waveguide direction (Y direction). In the present embodiment, the "periodic lattice row" is a row of lattice elements 112 arranged on an extension line (for example, each of dashed lines 1123 in FIG. 3) of one side that forms the triangular lattice.

As a result, in the horizontal plane, the lattice elements 112 are arranged in line symmetry with the center line (a dashed-dotted line 121 in FIG. 3) of the slot waveguide 12 in the waveguide direction in a top view as a symmetrical axis.

For the arrangement of the slot waveguide 12, a distance between the center line of the slot waveguide 12 in the waveguide direction of light in the top view (dashed-dotted line 1131 in FIG. 3) and the center of each of the lattice elements 112 closest to the slot waveguide 12 is approximately 286 nm.

For the arrangement of the slot waveguide 12, the lattice elements 112 are not limited to being arranged in line symmetry with the center line 1131 of the slot waveguide 12 as the symmetrical axis. It is desirable that the slot waveguide 12 be arranged between the periodic lattice rows, and the slot waveguide 12 is preferably arranged substantially parallel to the periodic lattice rows. Here, the "substantially parallel" state includes a case of being completely parallel and includes a case where a slight angle is formed with respect to the parallel line. In this case, the slight angle refers to such an angle that the attractive force trap light laser 13 and the repulsive force trap light laser 14 can propagate within the slot waveguide 12. Specifically, the angle is about larger than 0° and less than or equal to 10°.

The attractive force trap light laser 13 has a width of approximately 200 nm and a thickness of approximately from 100 to 150 nm. The attractive force trap light laser 13 includes a quantum well structure including, for example, an InGaAs quantum well layer and an InGaAsP (its composition wavelength: 1.1 μm) barrier layer on an InP substrate, and uses a semiconductor quantum well laser having an oscillation wavelength of 1500 nm.

When a rubidium atom is targeted as an atom to be trapped, the laser is not limited to this as long as it is a laser that oscillates at a wavelength being longer than that of its absorption edge (780 nm). A laser using an AlInGaAs semiconductor, a GaInNAs semiconductor, and a GaSb semiconductor may be used.

When an atom other than a rubidium atom is targeted as an atom to be trapped, it is only required to be a laser that oscillates at a wavelength being longer than that of an absorption edge of the atom. For example, in a case where strontium having an absorption edge of 460 nm is targeted, it is sufficient to be a laser that oscillates at a wavelength being larger than 460 nm, and an AlGaAs/GaAs semiconductor laser having an oscillation wavelength from 800 nm to 900 nm may be also used.

The attractive force trap light laser 13 is integrated into the photonic crystal body 11 by using a nano-control technology such as a transfer printing method, an atomic force microscope, a micro-manipulator or the like.

Operation Principle of Atom Trapping Device

In the present embodiment, photo-excitation is used for driving the attractive force trap light laser 13. Light that excites the attractive force trap light laser 13 is in a short wavelength band and is oscillated (emitted) from the excitation laser 14. In general, when the configuration of the photonic crystal according to the present embodiment is used, only the attractive force trap light laser 13 cannot trap atoms within the slot waveguide 12.

In order to trap atoms within the slot waveguide 12, a repulsive force trap light laser is required as well as the attractive force trap light laser 13. In the present embodiment, the excitation laser 14 having a wavelength being shorter than that of the absorption edge of the atom as an oscillation wavelength is used as the repulsive force trap light laser 14.

In the attractive force trap light laser 13, when atoms are irradiated with light having a wavelength being longer than that of light to be absorbed by the atoms, an electric field acts on the center and the atoms gather in a region having a strong electric field. Thus, an attractive force is likely to work on the atoms.

On the other hand, in the repulsive force trap light laser 14, when atoms are irradiated with light having a wavelength being shorter than that of light to be absorbed by the atoms, the light is scattered and force works in a direction opposite to the electric field. Thus, a repulsive force is likely to work on the atoms.

The detailed operation principle of the atom trapping device 10 according to the present embodiment will be described with reference to FIGS. 4 to 7. FIGS. 4 to 7 illustrate intensity distribution of electric fields of an attractive force trap light 15 and a repulsive force trap light 16, and illustrate a schematic view thereof. The intensity of an electric field is illustrated by bright and dark (black and white) patterns, which indicate that the electric field is strong in a bright (white) region and is weak in a dark region. In the schematic view, in the slot waveguide 12, a region with high intensity of the electric field is indicated by diagonal lines, and a region with low intensity is indicated by black. Also, a region where light is confined is indicated by dotted lines.

In addition, periodic positions between the circular holes 112 in a row 1122 of the circular holes that is closest to the slot waveguide 12, in other words, positions where the circular holes 112 are periodically arranged in a row 1124 of the circular holes that is second closest to the slot waveguide 12 are defined as A. In addition, positions where the circular holes 112 are periodically arranged in the row 1122 of the circular holes are defined as B (see FIGS. 4 and 6).

Figure 4:
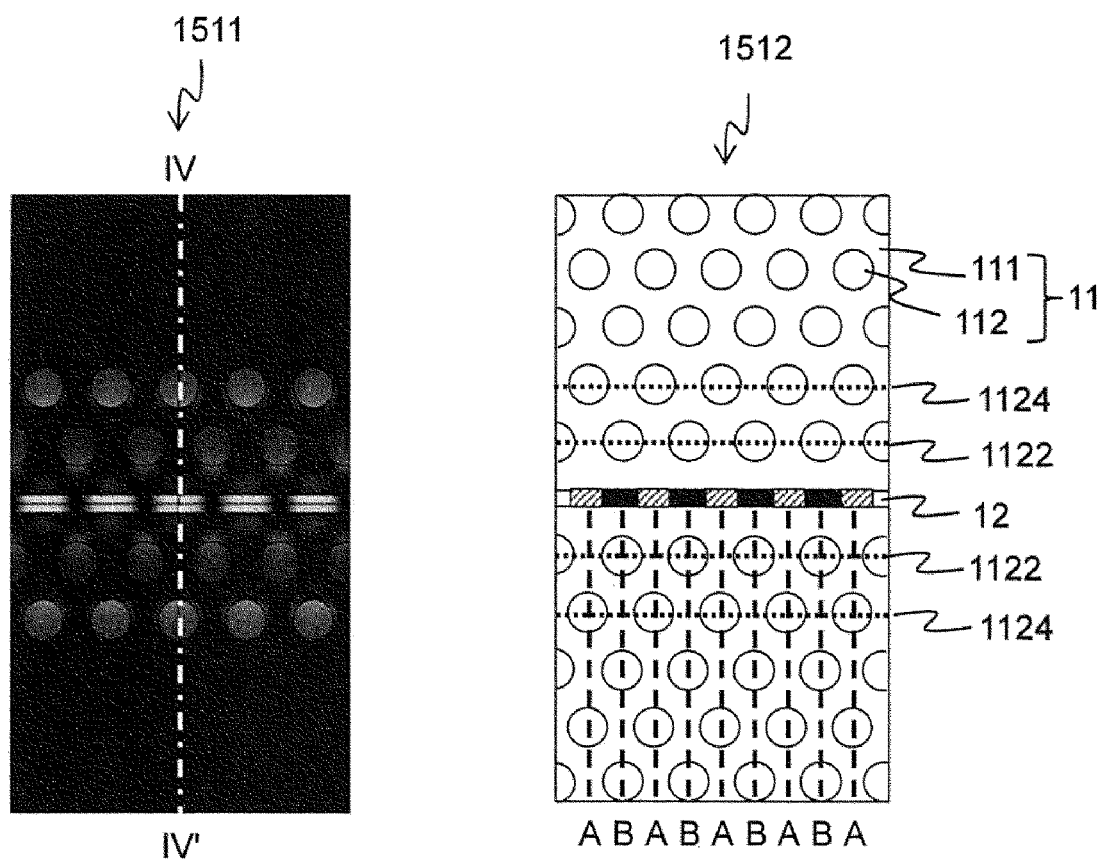
FIG. 4 is a top view of intensity distribution of an electric field of attractive force trap light in the atom trapping device according to the first embodiment of the present invention.
Figure 5:
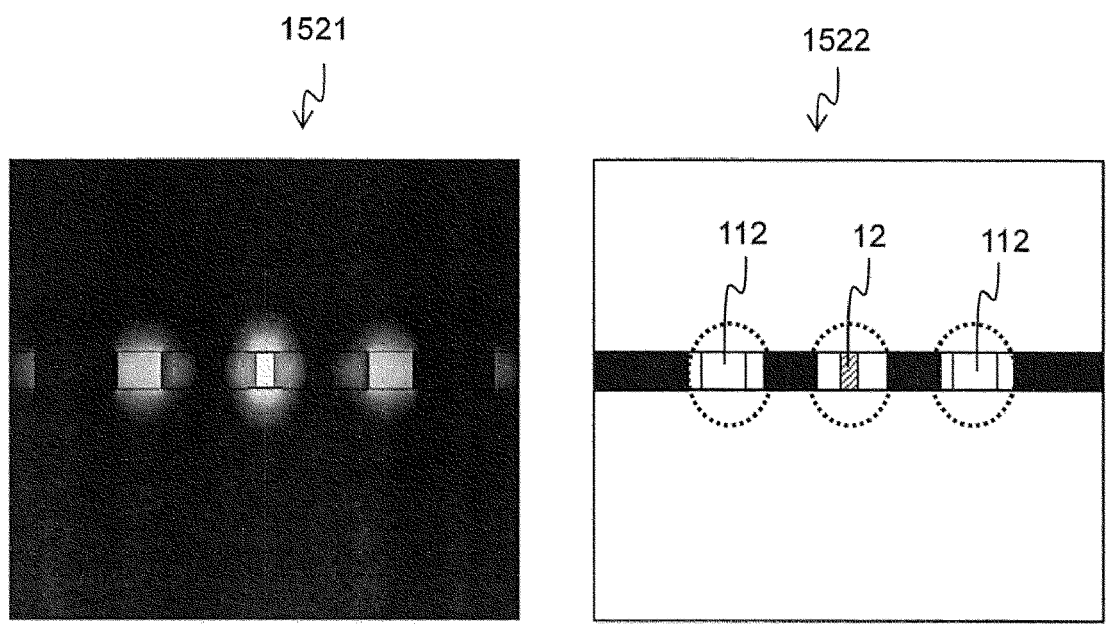
FIG. 5 is a cross-sectional view taken along line IV-IV' of the intensity distribution of the electric field of the attractive force trap light in the atom trapping device according to the first embodiment of the present invention.

FIG. 4 illustrates a top view 1511 of the intensity distribution of an electric field in a base mode of the attractive force trap light laser 13. Here, the base mode of the attractive force trap light laser 13 has a wavelength being longer than that of light to be absorbed by an atom. Also, FIG. 5 illustrates a cross-sectional view 1521 taken along the IV-IV' in the top view 1511. FIGS. 4 and 5 illustrate schematic views 1512 and 1522 of intensity distribution together.

As illustrated in FIG. 4, light in the base mode is concentrated in the slot waveguide 12, the electric field has periodic distribution in which the electric field is strong at a position A and the electric field is weak at a position B.

Also, as illustrated in FIG. 5, the light (electric field) in the base mode is concentrated in the slot waveguide 12. In the electric field distribution of the light in the base mode, in the waveguide direction (Y direction), the light in the base mode of the attractive force trap light laser 13 is absorbed by the atoms and works on the atoms as an attractive force, so the atoms gather in the slot waveguide 12 in which the electric field is strong and are confined within the slot waveguide 12.

On the other hand, in the horizontal direction (X direction), as a side wall of the slot waveguide 12 is provided within a range of an attractive force potential that confines the atoms, the atoms collide with the side wall before the attractive force works on the atoms and are jumped to the outside of the attractive force potential.

In this way, only the attractive force trap light 15 cannot trap the atoms. Thus, in addition to the attractive force trap light 15, the atoms can be trapped by using the repulsive force trap light 16. The details will be described below.

Figure 6:
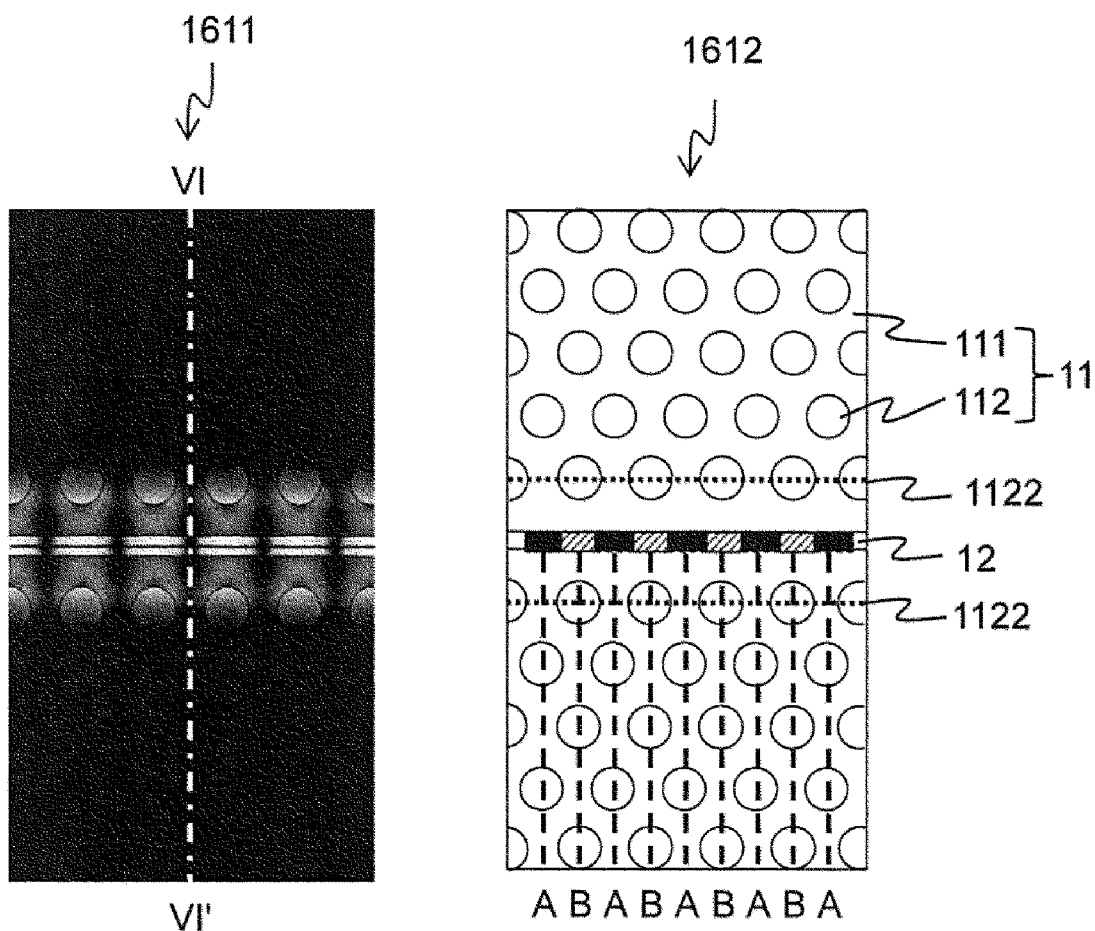
FIG. 6 is a top view of intensity distribution of an electric field of repulsive force trap light in the atom trapping device according to the first embodiment of the present invention.
Figure 7:
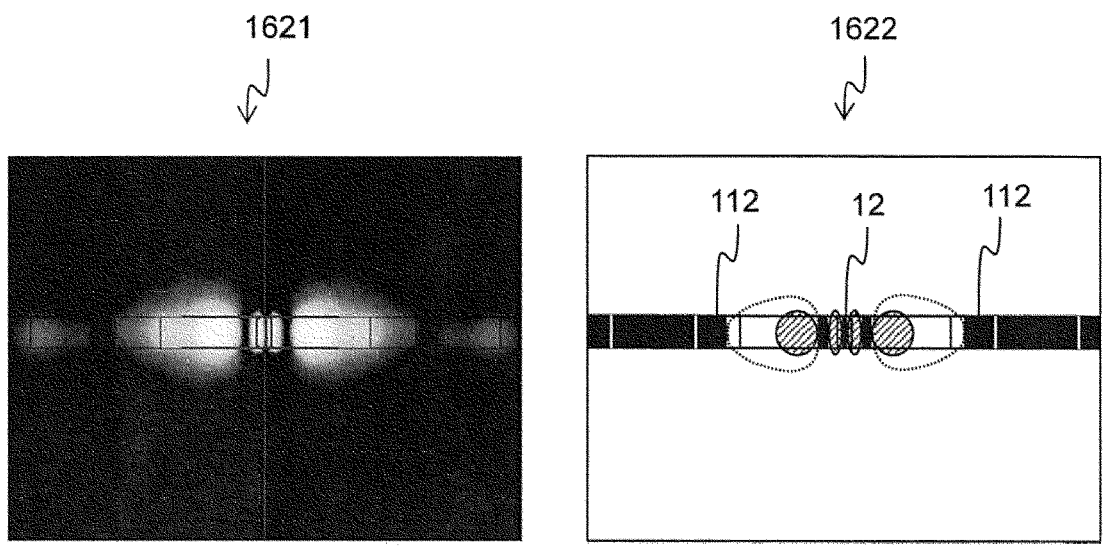
FIG. 7 is a cross-sectional view taken along line VI-VI' of the intensity distribution of the electric field of the repulsive force trap light in the atom trapping device according to the first embodiment of the present invention.

FIG. 6 illustrates a top view 1611 of the intensity distribution of an electric field in a high order mode of the repulsive force trap light laser 14. Here, the high order mode of the repulsive force trap light laser 14 has a wavelength being shorter than that of light to be absorbed by an atom. Also, FIG. 7 illustrates a cross-sectional view 1621 taken along VI-VI' in the top view 1611. In other words, the cross-sectional view 1621 is a cross-sectional view at the position A. FIGS. 3 and 4 illustrate schematic views 1612 and 1622 of intensity distribution together.

As illustrated in FIG. 6, the electric field in the high order mode of the repulsive force trap light laser 14 has periodic distribution in which the electric field is strong at the position B and the electric field is weak at the position A. That is, a period of the intensity of the electric field in the slot waveguide 12 is shifted at 180° from the base mode of the attractive force trap light laser 13.

Also, as illustrated in FIG. 7, the electric field in the high order mode of the repulsive force trap light laser 14 concentrates on the outside of the side wall of the slot waveguide 12 at the position A. As light in the high order mode of the repulsive force trap light laser 14 is not absorbed by atoms, the light works on the atoms as a repulsive force. Thus, a repulsive force is generated by the attractive force trap light 15 at the outside of the side wall of the slot waveguide 12, so the atoms can be confined within the slot waveguide 12 in the vertical direction in the waveguide direction (Y direction).

Figure 8:
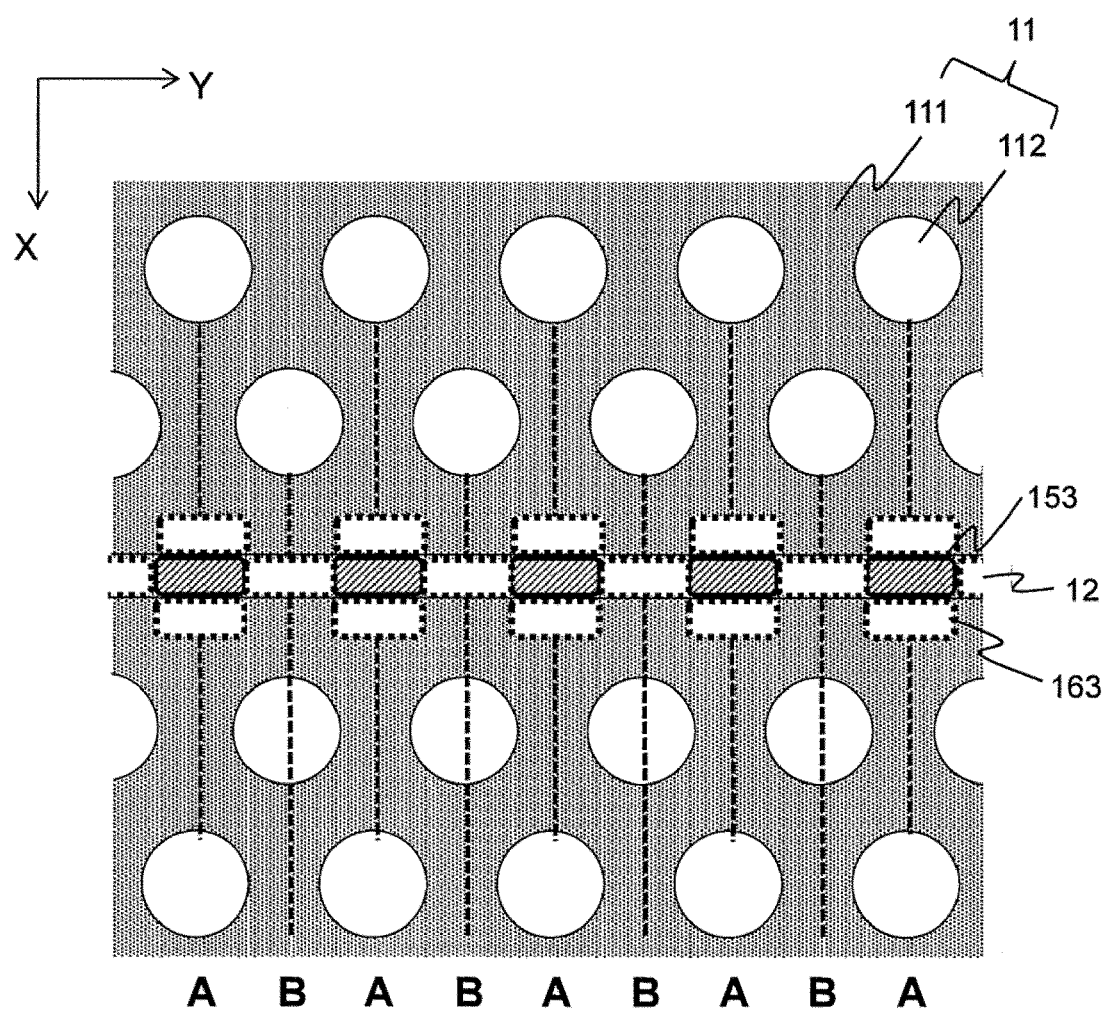
FIG. 8 is a view for describing an operation principle of the atom trapping device according to the first embodiment of the present invention.

FIG. 8 schematically illustrates intensity distribution of electric fields of the attractive force trap light laser 13 and the repulsive force trap light laser 14 around the slot waveguide 12. In FIG. 8, a hatched portion 153 indicates a region where the electric field of the attractive force trap light laser 13 is strong, and a dotted line portion 163 indicates a region where the electric field of the repulsive force trap light laser 14 is strong.

Within the slot waveguide 12, the electric field of the attractive force trap light laser 13 is strong at the position A and the electric field of the repulsive force trap light laser 14 is strong at the position B. That is, an attractive force works at the position A and a repulsive force works at the position B. As a result, atoms are gathered at the position A in the waveguide direction (Y direction) within the slot waveguide 12.

Light in the high order mode of the repulsive force trap light laser 14 is not absorbed by atoms and works on the atoms as the repulsive force. Thus, in the slot waveguide 12, the atoms are confined at the position A because the attractive force occurs at the position A and the repulsive force occurs at the position B.

On the other hand, at the outside of the side wall of the slot waveguide 12, the electric field of the attractive force trap light laser 13 is strong at the position A. As light in the high order mode of the repulsive force trap light laser 14 is not absorbed by the atoms, the light works on the atoms as the repulsive force. As a result, in the horizontal plane, the atoms are confined within the slot waveguide 12 in the horizontal direction (X direction) at the position A.

Also, in the vertical direction (Z direction) with respect to the horizontal plane, the atoms are confined at the position A within the slot waveguide 12 by the electric field of the attractive force trap light laser 13.

In this way, in addition to the attractive force trap light 15, the repulsive force trap light 16 can be used for confining and trapping the atoms within the slot waveguide 12.

According to the atom trapping device according to the present embodiment, a single laser (attractive force trap light laser) is integrated within the photonic crystal device, it is not necessary to dispose a plurality of large lasers at the outside, and thus, the overall atom trapping device can be made to be smaller. Additionally, fine lasers to be driven with low power are used, and thus, it is possible to significantly reduce power consumption (operating energy) of the atom trapping device and the system as a whole. Furthermore, when a nano-laser having a small electrostatic capacitance is used, an atom trapping device that modulates a potential at high speed (opens a trapping potential) can be achieved.

Second Embodiment

Next, a second embodiment of the present invention will be described. Similarly to the atom trapping device according to the first embodiment, an atom trapping device according to the second embodiment includes a photonic crystal body, a slot waveguide, and an attractive force trap light laser, and an operation principle thereof is substantially the same. The atom trapping device according to the second embodiment differs from that of the first embodiment in that a repulsive force trap light laser is integrated within the photonic crystal body (slab).

Figure 9:
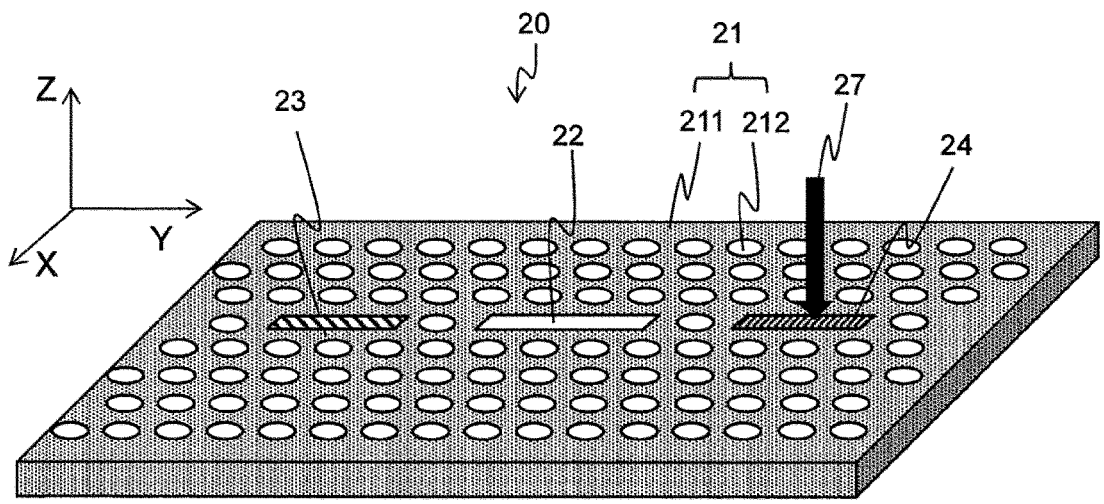
FIG. 9 is an overview of an atom trapping device according to a second embodiment of the present invention.
Figure 10:
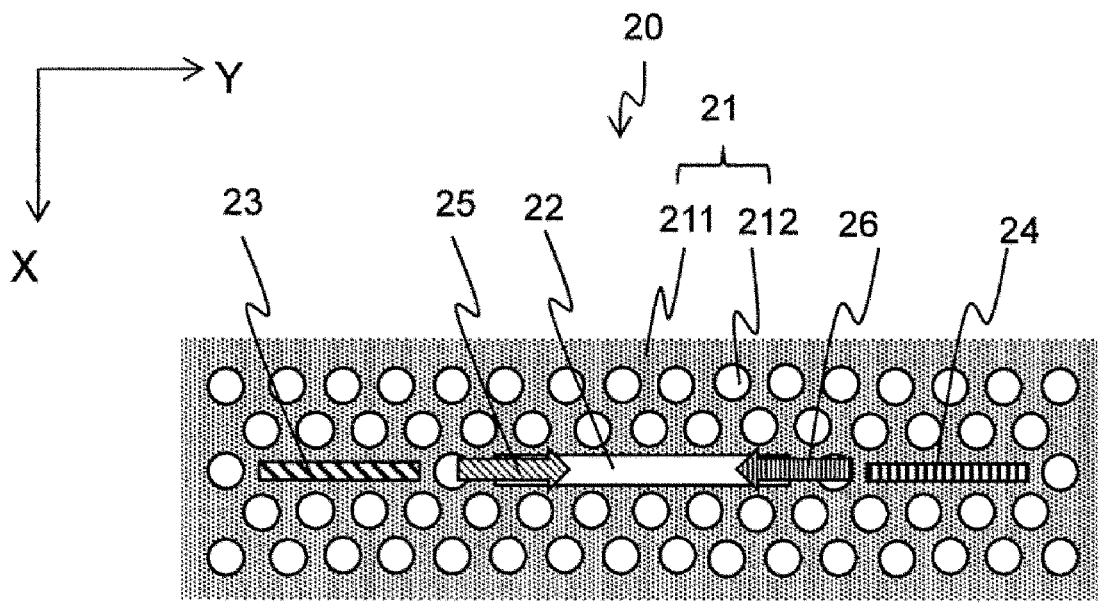
FIG. 10 is a top view of the atom trapping device according to the second embodiment of the present invention.

Each of FIGS. 9 and 10 illustrates an overview of an atom trapping device 20 according to the second embodiment. The atom trapping device 20 according to the second embodiment includes a photonic crystal body 21 and a slot waveguide 22, and is arranged with an attractive force trap light laser 23 and a repulsive force trap light laser 24 that face each other in a waveguide direction (Y direction) with the slot waveguide 22 serving as the center.

The attractive force trap light laser 23 and the repulsive force trap light laser 24 are integrated into the photonic crystal body 21 by using nano-control technology such as a transfer printing method, an atomic force microscope, a micro-manipulator or the like.

The configuration of the photonic crystal body 21 is similar to that of the first embodiment. The configuration of the slot waveguide 22 is similar to that in the first embodiment except that the slot waveguide 22 is in the inside of the photonic crystal body 21 rather than at an end portion of the photonic crystal body 21.

The attractive force trap light laser 23 is also similar to that in the first embodiment, and when an atom to be trapped is rubidium, the attractive force trap light laser 23 oscillates (emits light) at a wavelength being longer than that of an absorption line of the rubidium.

The repulsive force trap light laser 24 acts similarly to the excitation laser in the first embodiment, and excitation light 27 from the outside oscillates laser light (emits light) having a wavelength being shorter than that of the absorption line of the rubidium. The laser light works as a repulsive force trap light and excites the attractive force trap light laser 23. For example, gallium nitride (GaN)-based crystals, zinc oxide (ZnO)-based crystals, gallium phosphide (GaP)-based crystals, perovskite, and the like can be used as a material of the repulsive force trap light laser 24.

In this embodiment, attractive force trap light 25 by using the attractive force trap light laser 23 and repulsive force trap light 26 by using the repulsive force trap light laser 24 are propagated into the slot waveguide 22 to trap atoms within the slot waveguide 22 as in the first embodiment.

In this way, the atom trapping device 20 according to the second embodiment exhibits similar effects to those of the first embodiment. Furthermore, both the attractive force trap light laser 23 and the repulsive force trap light laser 24 are integrated into the photonic crystal body 21, which makes it possible to further reduce the size and to suppress optical loss.

Third Embodiment

Next, a third embodiment of the present invention will be described. An atom trapping device according to the third embodiment is substantially similar in the configuration and the operation principle to the atom trapping device according to the second embodiment. The atom trapping device according to the third embodiment differs from that of the second embodiment in that the repulsive force trap light laser integrated within the photonic crystal body (slab) is driven by current injection.

Figure 11:
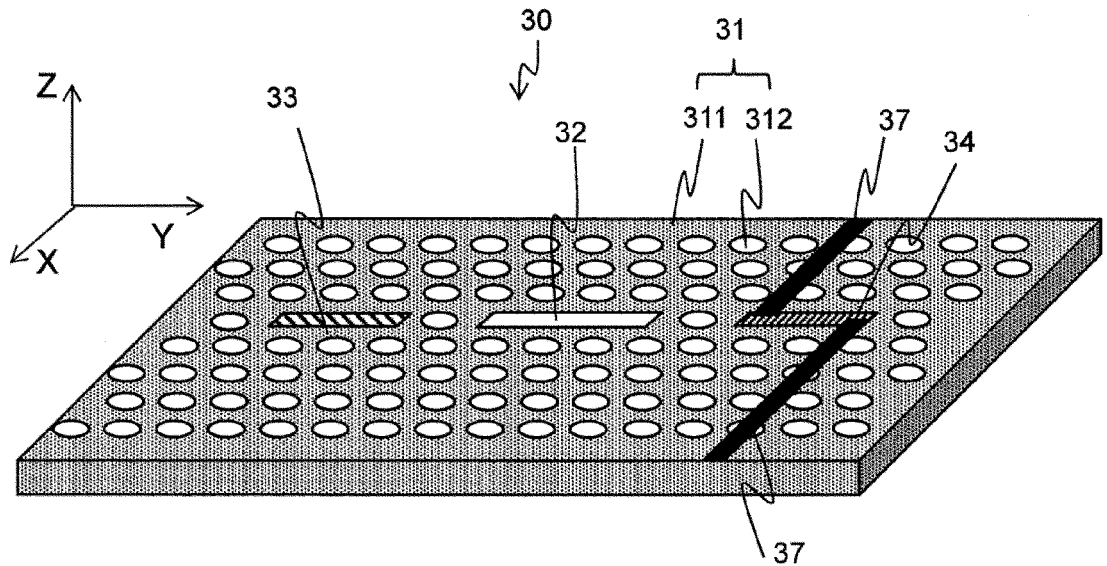
FIG. 11 is an overview of an atom trapping device according to a third embodiment of the present invention.
Figure 12:
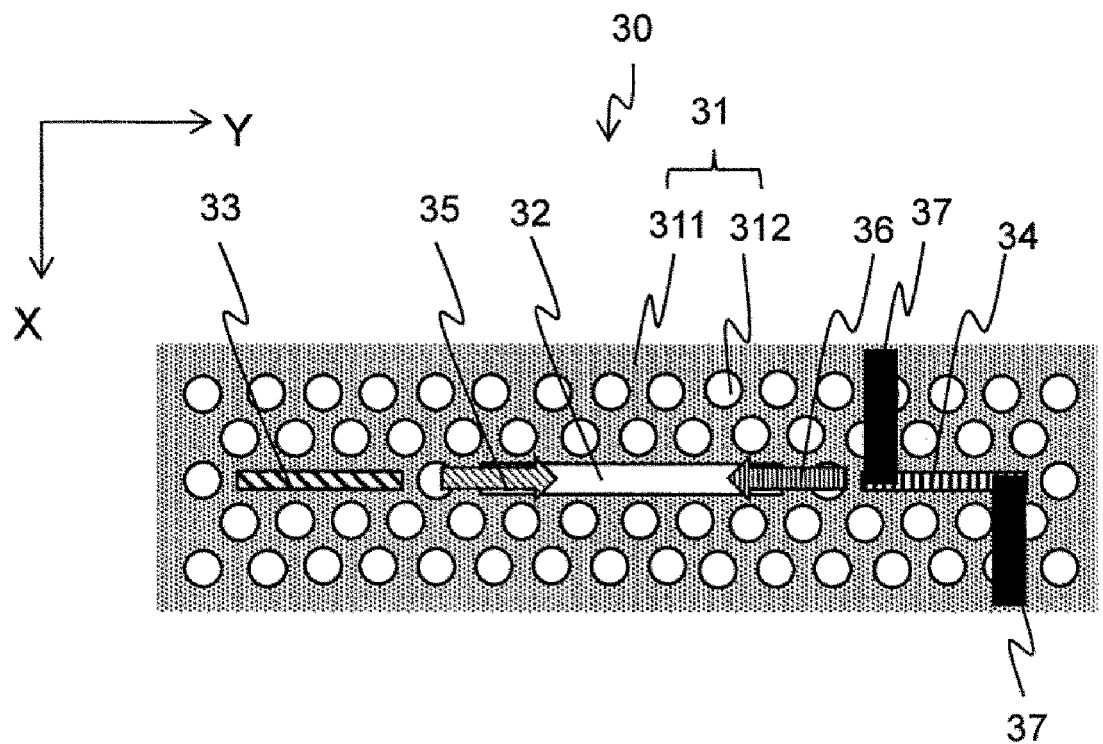
FIG. 12 is a top view of the atom trapping device according to the third embodiment of the present invention.

Each of FIGS. 11 and 12 illustrates an overview of an atom trapping device 30 according to the third embodiment. The atom trapping device 30 according to the third embodiment includes a photonic crystal body 31 and a slot waveguide 32, and an attractive force trap light laser 33 and a repulsive force trap light laser 34 are arranged in a waveguide direction (Y direction) with the slot waveguide 32 serving as the center. The repulsive force trap light laser 34 is driven by current injection and includes electrodes 37.

In the present embodiment, the repulsive force trap light laser 34 oscillates laser light 36 (emits light) having a wavelength being shorter than that of an absorption line of rubidium due to current injection. The laser light 36 excites the attractive force trap light laser 33 to oscillate laser light 35 (emit light) having a wavelength being longer than that of the absorption line of the rubidium. By propagating the attractive force trap light (laser light) 35 by the attractive force trap light laser 33 and the repulsive force trap light (laser light) 36 by the repulsive force trap light laser 34 into the slot waveguide 32, atoms can be trapped as in the first embodiment.

As described above, the atom trapping device 30 according to the third embodiment exhibits similar effects to those of the first and second embodiments. In addition, the repulsive force trap light laser 24 integrated within the photonic crystal body 21 is driven by current injection, an external excitation laser is unnecessary, and thus, further miniaturization and low power consumption can be achieved as the whole device.

Fourth Embodiment

Next, a fourth embodiment of the present invention will be described. Similar to the atom trapping devices according to the second and third embodiments, an atom trapping device according to the fourth embodiment includes a photonic crystal body, a slot waveguide, and an attractive force trap light laser, and a repulsive force trap light laser, and an operation principle is also substantially the same. The atom trapping device according to the fourth embodiment differs from those of the second and third embodiments in that both the attractive force trap light laser and the repulsive force trap light laser are driven by current injection, and the slot waveguide, the attractive force trap light laser, and the repulsive force trap light laser are arranged in a different way.

Figure 13:
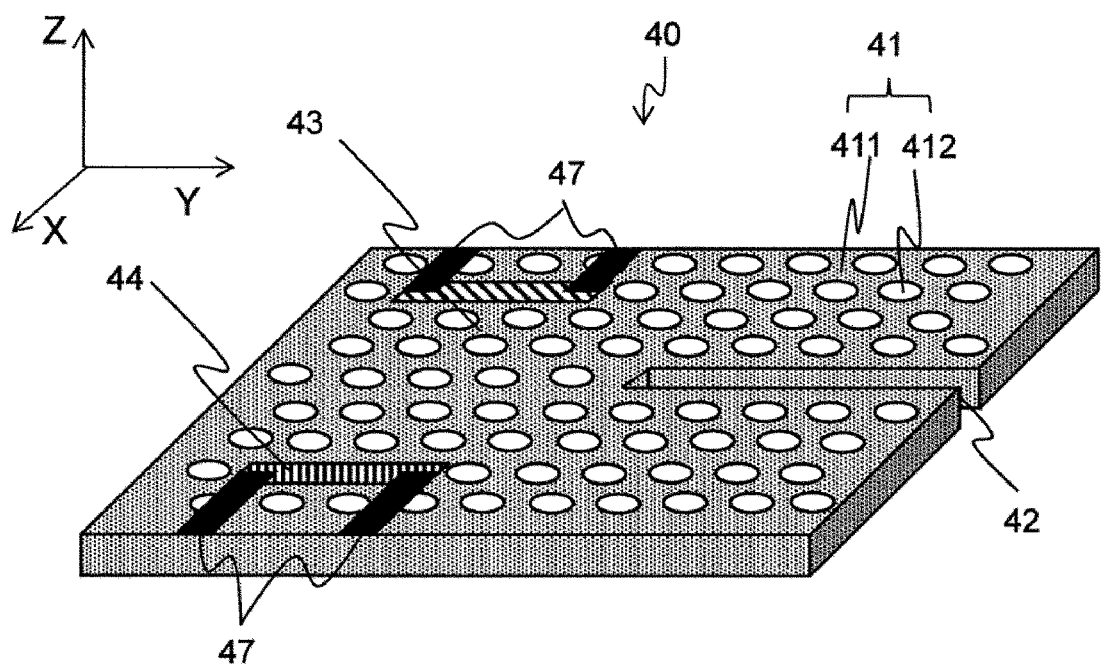
FIG. 13 is an overview of an atom trapping device according to a fourth embodiment of the present invention.
Figure 14:
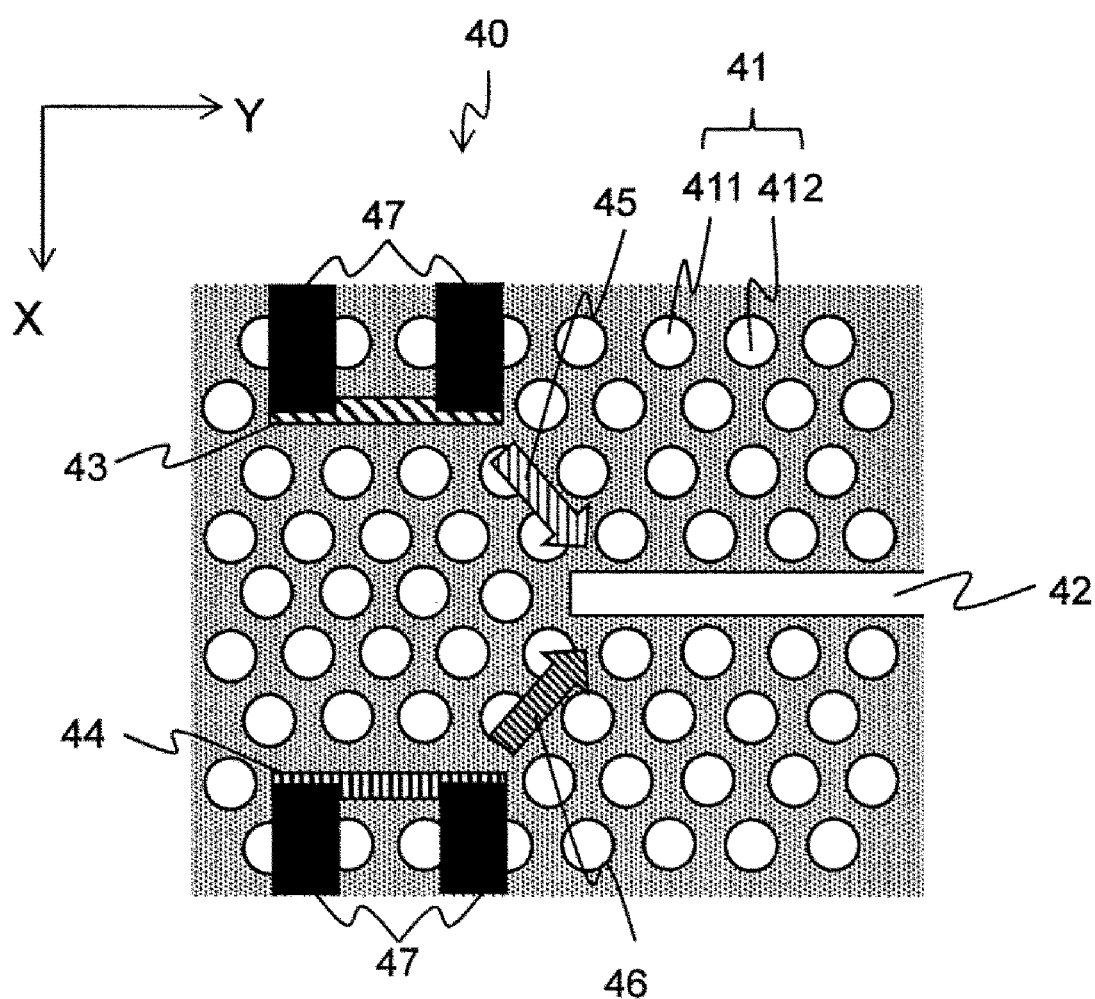
FIG. 14 is a top view of the atom trapping device according to the fourth embodiment of the present invention.

Each of FIGS. 13 and 14 illustrates an overview of an atom trapping device 40 according to the fourth embodiment. The atom trapping device 40 according to the fourth embodiment has a photonic crystal body 41, a slot waveguide 42, an attractive force trap light laser 43, and a repulsive force trap light laser 44. The attractive force trap light laser 43 and the repulsive force trap light laser 44 are driven by current injection and includes electrodes 47.

As the attractive force trap light laser 43 is driven by current injection and excitation light from the repulsive force trap light laser 44 is not required, the attractive force trap light laser 43 and the repulsive force trap light laser 44 are not necessarily arranged so as to face each other.

In the present embodiment, the attractive force trap light laser 43 oscillates laser light 45 (emits light) having a wavelength being longer than that of an absorption line of rubidium due to current injection. On the other hand, the repulsive force trap light laser 44 oscillates laser light 46 (emits light) having a wavelength being shorter than that of the absorption line of rubidium due to current injection. The laser light 45 and the laser light 46 are incident on the slot waveguide 42 from an oblique direction and are propagated into the slot waveguide 42, allowing atoms to be trapped as in the first embodiment.

As described above, the atom trapping device 40 according to the fourth embodiment exhibits similar effects to those of the first to third embodiments. Furthermore, potentials of an attractive force and a repulsive force can be independently controlled because the attractive force trap light laser 43 and the repulsive force trap light laser 44 can be individually driven by current injection.

Also, the attractive force trap light laser, the repulsive force trap light laser, and the slot waveguide can be arranged with the high degree of freedom, because the attractive force trap light laser 43 and the repulsive force trap light laser 44 do not need to be arranged so as to face each other.

In the present embodiment, the attractive force trap light laser and the repulsive force trap light laser are caused to oscillate (to emit light) by current injection, but even when the attractive force trap light laser and the repulsive force trap light laser are excited and caused to oscillate (to emit light) by separate excitation light, it is possible to operate as an atom trapping device.

According to the atom trapping device according to embodiments of the present invention, at least one laser (attractive force trap light lasers) is integrated into a chip (photonic crystal), there is no need to dispose a plurality of large lasers at the outside, and thus, the overall atom trapping device can be made to be smaller. Additionally, fine lasers to be driven with low power are used, and thus, it is possible to significantly reduce power consumption (operating energy) of the atom trapping device and the system as a whole. Furthermore, when a nano-laser having a small electrostatic capacitance is used, an atom trapping device that modulates a potential at high speed (opens a trapping potential) can be achieved.

In the embodiment of the present invention, although an example has been illustrated in which the slot waveguide is provided so as to be perpendicular to the end face of the photonic crystal body, the slot waveguide is not necessarily provided to be perpendicular to the end face, and the slot waveguide may be provided in an oblique direction with respect to the end face of the photonic crystal body. When the lattice elements of the photonic crystal body are in a triangular lattice shape, the lattice elements may be provided at an angle of 30° (or 150°) with respect to the end face of the photonic crystal body.

In the embodiment of the present invention, the lattice elements of the photonic crystal body have a cylindrical hollow structure and are periodically provided in the triangular lattice shape, but the present invention is not limited thereto. The shape does not need to be a cylindrical shape, and may be a pillar shape, and it is only required that a plurality of solid objects having substantially identical shapes are periodically arranged. The lattice elements do not need to have the hollow structure, and are only required to have a different refractive index from that of the base. The lattice elements do not need to be provided in the triangular lattice shape, and are only required to have a square lattice shape. Also, other dimensions may be used in accordance with a wavelength of light to be targeted.

In the embodiment of the present invention, an example of the structure, size, material, and the like of each of the constituent components is illustrated in the configuration, the manufacturing method, and the like of the photonic crystal optical element, but the present invention is not limited thereto. It is sufficient that the photonic crystal optical element exhibits functions and exhibits effects.

INDUSTRIAL APPLICABILITY

Embodiments of the present invention can be applied to the development of quantum information devices such as quantum computers, single-photon sources, quantum simulators and the like and platforms thereof as measurement devices using cold atoms.

REFERENCE SIGNS LIST

10 Atom trapping device
101 Photonic crystal device
11 Photonic crystal body
111 Base
112 Lattice element
12 Slot waveguide
13 Attractive force trap light laser
14 Excitation laser (Repulsive force trap light laser).

The invention claimed is:

1. A photonic crystal device to be used for trapping an atom, the photonic crystal device comprising:
a photonic crystal body;
a slot waveguide; and
an attractive force trap light laser,
wherein the photonic crystal body includes a base and a plurality of lattice elements periodically provided on the base,
wherein the slot waveguide is arranged between a first periodic lattice row and a second periodic lattice row, the slot waveguide including an opening on a first side face of the photonic crystal body,
wherein the attractive force trap light laser is configured to be excited by excitation light incident from the opening, and
wherein the attractive force trap light laser is configured to oscillate at a wavelength longer than a wavelength of an absorption edge of the atom.

2. The photonic crystal device according to claim 1, wherein the excitation light is oscillated by an excitation light laser.

3. The photonic crystal device according to claim 1, wherein each of the plurality of lattice elements has a different refractive index than the base.

4. An atom trapping device comprising:
a photonic crystal device to be used for trapping an atom, the photonic crystal device comprising:
a photonic crystal body;
a slot waveguide; and
an attractive force trap light laser, wherein the photonic crystal body includes a base and a plurality of lattice elements periodically provided on the base, wherein the slot waveguide is arranged between a first periodic lattice row and a second periodic lattice row, the slot waveguide including an opening on a first side face of the photonic crystal body, wherein the attractive force trap light laser is configured to be excited by excitation light incident from the opening, and wherein the attractive force trap light laser is configured to oscillate at a wavelength longer than a wavelength of an absorption edge of the atom; and
an excitation light laser, wherein the excitation light laser is configured to oscillate the excitation light.

5. The atom trapping device according to claim 4, wherein each of the plurality of lattice elements have a different refractive index than the base.

6. An atom trapping device configured to trap an atom, the atom trapping device comprising:
a photonic crystal body;
a slot waveguide;
an attractive force trap light laser; and
a repulsive force trap light laser,
wherein the photonic crystal body includes a base and a plurality of lattice elements periodically provided on the base,
wherein the slot waveguide is arranged between a first periodic lattice row and a second periodic lattice row within the photonic crystal body,
wherein the attractive force trap light laser is configured to oscillate at a wavelength longer than a wavelength of an absorption edge of the atom,
wherein the repulsive force trap light laser is configured to oscillate at a wavelength shorter than the wavelength of the absorption edge of the atom, and
the attractive force trap light laser and the repulsive force trap light laser are arranged in such a manner that light of the attractive force trap light laser and light of the repulsive force trap light laser are incident on the slot waveguide.

7. The atom trapping device according to claim 6, wherein the attractive force trap light laser and the repulsive force trap light laser are arranged in such a manner that the attractive force trap light laser and the repulsive force trap light laser face each other in a waveguide direction with the slot waveguide serving as a center.

8. The atom trapping device according to claim 7, wherein the repulsive force trap light laser oscillates by current injection.

9. The atom trapping device according to claim 8, wherein the attractive force trap light laser oscillates by current injection.

10. The atom trapping device according to claim 7, wherein the attractive force trap light laser oscillates by current injection.

11. The atom trapping device according to claim 6, wherein the repulsive force trap light laser oscillates by current injection.

12. The atom trapping device according to claim 6, wherein the attractive force trap light laser oscillates by current injection.

* * * * *